(12) United States Patent
Glover et al.

(10) Patent No.: US 9,664,746 B2
(45) Date of Patent: May 30, 2017

(54) BATTERY CHARGE MEASUREMENT ALGORITHM MANAGEMENT

(71) Applicant: International Business Machines Corporation, Armonk, NY (US)

(72) Inventors: Adrian P. Glover, Katy, TX (US); Jacob J. Smalts, Richmond, TX (US); Brent W. Yardley, Hillsboro, OR (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 14/644,379

(22) Filed: Mar. 11, 2015

(65) Prior Publication Data
US 2016/0266979 A1    Sep. 15, 2016

(51) Int. Cl.
| | |
|---|---|
| *G06F 11/07* | (2006.01) |
| *G01R 31/36* | (2006.01) |
| *G06F 9/30* | (2006.01) |
| *G06F 1/26* | (2006.01) |
| *G06F 11/20* | (2006.01) |

(Continued)

(52) U.S. Cl.
CPC ........... *G01R 31/3682* (2013.01); *G06F 1/26* (2013.01); *G06F 9/30083* (2013.01); *G06F 11/2015* (2013.01); *G06F 11/3058* (2013.01); *G01R 31/36* (2013.01); *G06F 11/1441* (2013.01); *G06F 11/3003* (2013.01)

(58) Field of Classification Search
CPC ............................ G06F 1/3212; G06F 11/3058
USPC ...................................................... 714/14, 22
See application file for complete search history.

(56) References Cited

U.S. PATENT DOCUMENTS

| | | | |
|---|---|---|---|
| 8,108,720 B2 * | 1/2012 | Beattie, Jr. ................ | G06F 1/20 714/14 |
| 2003/0222622 A1 * | 12/2003 | Franke .................. | H02J 7/0075 320/135 |

(Continued)

FOREIGN PATENT DOCUMENTS

JP      2000228832 A     8/2000

OTHER PUBLICATIONS

Mell et al., "The NIST Definition of Cloud Computing," National Institute of Standards and Technology, U.S Department of Commerce, Special Publication 800-145, Sep. 2011.

(Continued)

*Primary Examiner* — Chae Ko
(74) *Attorney, Agent, or Firm* — Nicholas D. Bowman

(57) ABSTRACT

A method of backing up data from an electronic system is disclosed. The method may include detecting an operating mode of the battery subsystem that is a maintenance discharge cycle operating mode and in response, calculating, using a first algorithm, the available battery capacity relative to a minimum battery capacity. The method may also include detecting an operating mode of the battery subsystem that is a normal operating mode and in response, calculating, using a second algorithm, the available battery capacity relative to a maximum battery capacity. The method may also include comparing the available battery capacity to a battery capacity sufficient to complete a backup operation, detecting a backup trigger condition and in response to the backup trigger condition and the available battery capacity being sufficient to complete a backup operation, backing up, data from the electronic system.

16 Claims, 6 Drawing Sheets

(51) Int. Cl.
*G06F 11/30* (2006.01)
*G06F 11/14* (2006.01)

(56) References Cited

U.S. PATENT DOCUMENTS

| | | | |
|---|---|---|---|
| 2009/0035609 A1* | 2/2009 | Ludtke | H01M 10/48 |
| | | | 429/10 |
| 2009/0160402 A1* | 6/2009 | Wang | H01M 10/4285 |
| | | | 320/134 |
| 2009/0195212 A1 | 8/2009 | Chiasson et al. | |
| 2010/0194341 A1 | 8/2010 | Anupindi et al. | |
| 2011/0068747 A1* | 3/2011 | Dung | H02J 7/0068 |
| | | | 320/132 |
| 2011/0080139 A1* | 4/2011 | Troxel | H01M 10/4207 |
| | | | 320/134 |
| 2011/0133697 A1 | 6/2011 | Matsuura et al. | |
| 2012/0268059 A1 | 10/2012 | Nishikawa et al. | |
| 2013/0086409 A1* | 4/2013 | Lu | H04L 12/2807 |
| | | | 713/340 |
| 2013/0097458 A1* | 4/2013 | Sekino | G06F 11/1441 |
| | | | 714/6.3 |
| 2013/0205147 A1 | 8/2013 | Tsao | |
| 2013/0207613 A1 | 8/2013 | Loncarevic | |
| 2013/0295439 A1* | 11/2013 | Masarapu | H01M 4/485 |
| | | | 429/163 |
| 2014/0092375 A1 | 4/2014 | Raghavan et al. | |
| 2014/0298045 A1* | 10/2014 | Sieber | G06F 1/263 |
| | | | 713/300 |
| 2015/0077126 A1* | 3/2015 | Wang | H01M 10/44 |
| | | | 324/428 |

OTHER PUBLICATIONS

Orlando et al., "IBM FlashSystem 840 Product Guide," IBM Redbooks Product Guide, Published Jan. 16, 2014, Last Updated Jul. 21, 2014, http://www.redbooks.ibm.com/abstracts/tips1079.html?Open.

Ross et al., "Development of a Battery Runtime Prediction Algorithm and a Method for Determining its Accuracy," 17th International Telecommunications Energy Conference, Oct. 29-Nov. 1, 1995, pp. 277-283 DOI: 10.1109/INTLEC.1995.498965.

* cited by examiner

BATTERY CHARGE MEASUREMENT ALGORITHM MANAGEMENT

BACKGROUND

The present disclosure generally relates to battery charge measurement algorithms. In particular, this disclosure relates to selecting a battery charge measurement algorithm to determine a battery charge capacity for a data backup operation.

An electric battery is an electrochemical device consisting of one or more cells that convert stored chemical energy into electrical energy. Each cell may contain a positive terminal, or cathode, and a negative terminal, or anode. Electrolytes may allow ions to move between the electrodes and terminals, which allows current to flow out of the battery to perform useful work.

Primary or "disposable" batteries, such as alkaline batteries, may be used once and subsequently discarded due to the electrode materials being irreversibly changed during discharge. Secondary or "rechargeable" batteries can be discharged and recharged multiple times; the original composition of the electrodes can be restored by reversing current flow at the battery terminals. Rechargeable battery types may include lead-acid batteries used in vehicles and lithium-ion batteries used in portable electronic devices. The maximum charge storage capacity of a rechargeable battery may decrease from an original (new condition) charge storage capacity over a period of time and/or number of charge/discharge cycles.

SUMMARY

Various aspects of the present disclosure may be useful for maintaining a distributed uninterruptible power supply (UPS) within an electronic system. An electronic system configured according to embodiments of the present disclosure may make efficient use of available backup battery capacity during both normal operating modes and maintenance discharge cycle battery operating modes.

Embodiments may be directed towards a method of backing up, based upon an available battery capacity of at least one backup battery cell of at least one battery subsystem, data from an electronic system. The method may include detecting a first operating mode of the at least one battery subsystem that is a maintenance discharge cycle operating mode and calculating, in response to the first operating mode of the at least one battery subsystem and by using a first algorithm, the available battery capacity relative to a minimum battery capacity. The method may also include detecting a second operating mode of the at least one battery subsystem that is a normal operating mode and calculating, in response to the second operating mode of the at least one battery subsystem and by using a second algorithm, the available battery capacity relative to a maximum battery capacity. The method may also include comparing the available battery capacity to a battery capacity sufficient to complete a backup operation, detecting a backup trigger condition and backing up, in response to the backup trigger condition and in response to the available battery capacity being sufficient to complete a backup operation, data from the electronic system.

Embodiments may also be directed towards a computer program product for backing up, based upon an available battery capacity of at least one backup battery cell of at least one battery subsystem, data from an electronic system. The computer program product may include at least one computer readable storage medium having program instructions embodied therewith, where the at least one computer readable storage medium is not a transitory signal per se. The program instructions may be executable by at least one computer processor circuit to cause the at least one computer processor circuit to perform a method. The method may include detecting a first operating mode of the at least one battery subsystem that is a maintenance discharge cycle operating mode and calculating, in response to the first operating mode of the at least one battery subsystem and by using a first algorithm, the available battery capacity relative to a minimum battery capacity. The method may also include detecting a second operating mode of the at least one battery subsystem that is a normal operating mode and calculating, in response to the second operating mode of the at least one battery subsystem and by using a second algorithm, the available battery capacity relative to a maximum battery capacity. The method may also include comparing the available battery capacity to a battery capacity sufficient to complete a backup operation, detecting a backup trigger condition and backing up, in response to the backup trigger condition and in response to the available battery capacity being sufficient to complete a backup operation, data from the electronic system.

Embodiments may also be directed towards an electronic system for, in response to a backup trigger condition, backing up data. The electronic system may include at least one battery subsystem. The at least one battery subsystem may include at least one battery cell coupled to a power bus to, during hold-up operations and backup operations, supply power to at least one memory subsystem and at least one processor unit. The at least one battery subsystem may also include a fuel gauge circuit coupled to the at least one battery cell and to battery control logic, to, in response to detected first and second operating modes of the at least one battery subsystem, supply battery status information to the battery control logic. The at least one battery subsystem may also include battery control logic coupled to the power bus to calculate, in response to battery status information and in response to detected first and a second operating modes received from the at least one processor unit, available battery capacity information and detect a backup trigger condition. The electronic system may also include at least one processor unit coupled to the battery control logic and to a fuel gauge circuit. The at least one processor unit may be configured to receive available battery capacity information, detect a first and a second operating mode of at least one battery subsystem and compare the available battery capacity information to a battery capacity sufficient to complete a backup operation. The at least one processor unit may also be configured to issue, in response to the compare and in response to a backup trigger condition, a backup command. The electronic system may also include at least one memory subsystem. The at least one memory subsystem may include control logic coupled to the at least one processor unit, to, in response to the backup command, back up data from the electronic system.

Aspects of the various embodiments may be used to reduce the exposure of electronic systems to windows of time in which there is a single point-of-failure, i.e., a single battery or battery pack to backup data from the system. Aspects of the various embodiments may also be useful for allowing an electronic system to stay in a fully protected state for a longer time period, relative to other types of systems, by taking advantage of both "battery floor" and "battery ceiling" capacity calculation methods.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
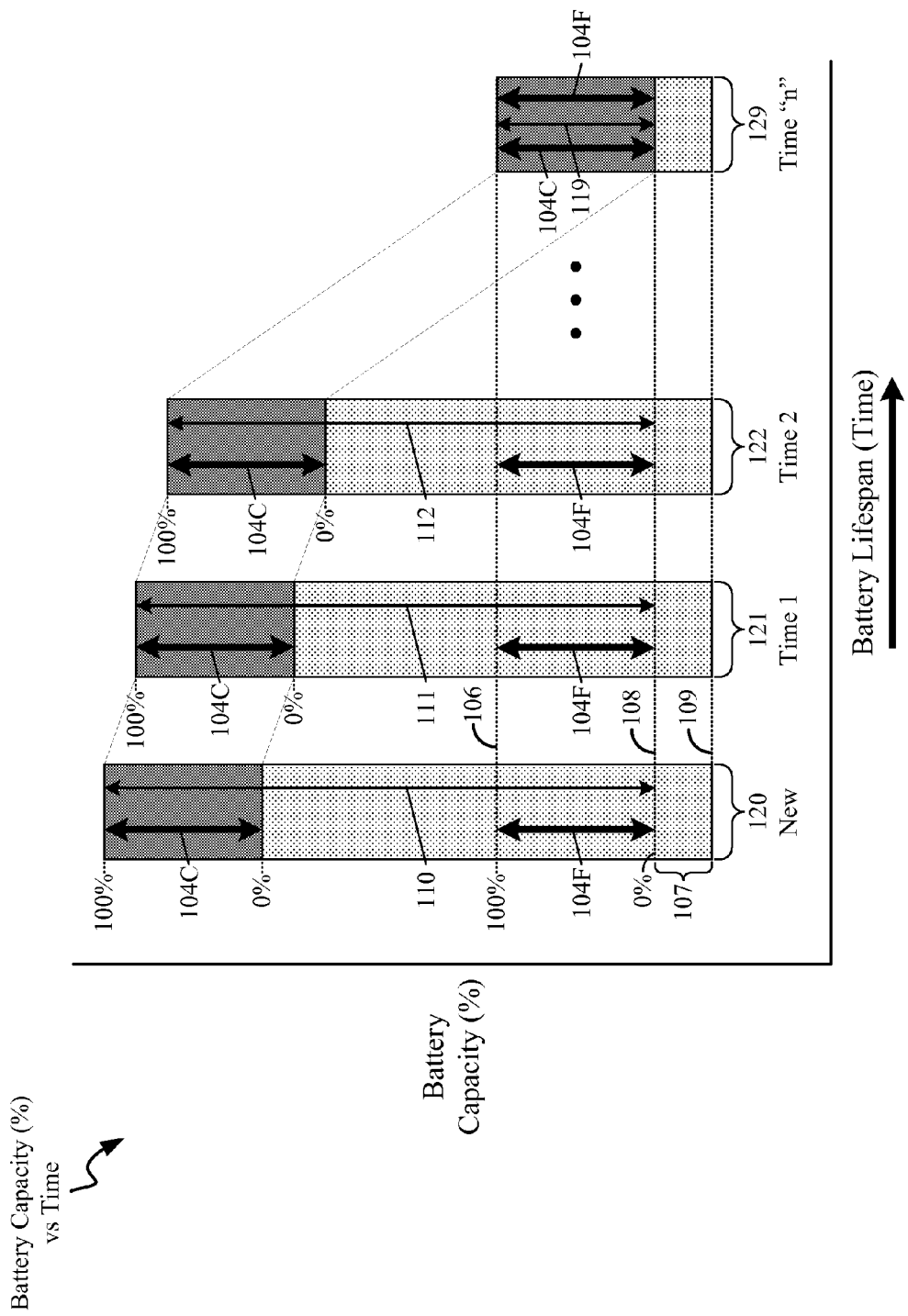
FIG. 1 is a graph depicting battery charge capacity as a function of time, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

The present disclosure may be a method, a system, and/or a computer program product. The computer program product may include a computer readable storage medium (or media) having computer readable program instructions thereon for causing a processor to carry out aspects of the present invention.

Certain embodiments of the present disclosure can be appreciated in the context of providing enhanced backup battery capacity and data security to electronic systems and equipment such as computing systems, which may be used to provide computational capability to clients and users. Such computing systems may include, but are not limited to, high-performance computing (HPC) systems, supercomputers and other types of special-purpose computers. While not necessarily limited thereto, embodiments discussed in this context can facilitate an understanding of various aspects of the disclosure. Certain embodiments may also be directed towards other equipment and associated applications, such as providing enhanced backup battery capacity and data security to electronic equipment enclosures such as servers, which may be used to provide data to clients attached to a server through a network. Such servers may include, but are not limited to, web servers, application servers, mail servers, and virtual servers. Embodiments may also be directed towards other types of electronic systems which contain data stored on volatile data storage devices, to facilitate orderly transfer of the data from the volatile data storage devices to one or more non-volatile data storage devices.

For ease of discussion, the term "battery" is used herein, however, it is understood that various embodiments can also be useful with regards to various configurations of batteries such as "battery packs" or "battery modules". A battery pack or battery module may include a variety of types of interconnect configurations between individual batteries or battery cells, and may generally be used in an electronic system as a single functional unit.

A battery, battery pack, or battery subsystem may be used within an electronic system to provide uninterruptible power during interruptions in power supplied to the system from external sources such as alternating current (AC) line voltage. The battery may be used to ensure continued function of the electronic system during power interruptions or events, and may also be used to enable orderly transfer of data, before system shutdown, from volatile data storage devices to non-volatile data storage devices.

A battery "fuel gauge" or similar device may be used to monitor the amount of energy that is stored in a battery or battery subsystem. A battery fuel gauge may periodically require a "maintenance discharge/learning cycle" to be performed on the battery in order to confirm the state of charge of the battery. During a maintenance discharge/learning cycle, a battery or battery subsystem within an electronic system may be discharged to allow for the calibration of system(s) (including the battery fuel gauge) used to monitor the state of charge of the battery.

The process of discharging a battery used for backup operations and/or "hold-up" (uninterruptible power supply) purposes can, in an electronic system having more than one battery, expose data stored on the system to a single point of failure (battery) risk. The discharge process can force an electronic system having redundant batteries or battery subsystems to become non-redundant for a period of time. Reducing the time interval, during the discharging process, of exposure of the electronic system to a single point of failure risk can result in improved robustness of the electronic system.

Electronic systems that use batteries to provide backup power may fall into one of two categories. A first category can include systems which verify that there is at least enough energy in the battery relative to a fully discharged state ("battery floor") before coming online to provide backup power for the electronic system. A second category can include systems which verify that there is at least enough energy in the battery relative to (above) a certain lower threshold measured from the fully charged state ("battery ceiling") before coming online to provide backup power for the electronic system.

Various embodiments of the present disclosure relate to the use of a method of managing battery charge measurement algorithms to determine available backup battery charge capacity for an electronic system. The method of managing battery charge measurement algorithms may therefore be useful for merging the benefits of both "battery floor" and "battery ceiling" measurement algorithms. Benefits of battery measurement algorithm management may include both an increased battery/system endurance and battery redundancy period. Benefits may also include increased electronic system reliability and a favorable projection of electronic system reliability to clients and/or users.

Increased reliability of an electronic system containing data may result from the use of the algorithm management method. The method may help to minimize exposure of an electronic system containing data to potentially harmful events such as power failures or power line disturbance is (PLDs). An electronic system designed according to certain embodiments may be compatible with existing and proven battery, electronic monitoring circuit, and backup system technologies, and may be a useful and cost-effective way to protect electronic systems containing data from data loss or corruption due to power interruption events. The benefits of various embodiments of the present disclosure may be realized during extended PLD periods, during insertion of new backup batteries into the electronic system, and during times of failure of one or more backup batteries within the system.

Managing charge measurement algorithms for batteries configured to provide power to an electronic system during a data backup operation may be useful for increasing the amount of time that the data contained in an electronic system remains in a fully protected state. The method of battery charge measurement algorithm management may incorporate and alternate between two charge measurement algorithms. During a "maintenance discharge cycle", the amount of energy required in a battery or battery module can be measured from the "floor" or fully discharged state of the battery. Other under conditions, the charge may be measured from the "ceiling" or fully charged state of the battery. This method can allow the electronic system to stay in a fully protected state for much longer than a system using just one of the measurement algorithms. The system may also take advantage of both the "ceiling" calculations for maximum battery endurance, and the "floor" for maximizing the redundancy period.

According to embodiments, when a "maintenance discharge cycle" begins, the calculation algorithm can be switched from the "ceiling" calculation to the "floor" calculation algorithm. Once the discharge cycle is complete and the battery is fully charged back up, the algorithm can be switched back to the "ceiling" method. A beneficial result of switching algorithms may include an increase of the amount of time that the electronic system stays protected by the battery or battery module during the amount of time it takes to discharge the energy between the lower threshold of the "ceiling" method to the upper threshold of the "floor" method.

In embodiments, the method of charge measurement algorithm management may be useful during "maintenance discharge cycles" in which a battery monitoring system may recalibrate to accurately measure the amount of battery capacity remaining in a battery or battery module. The method may also be useful during extended PLD periods, during insertion of a new battery, and during the replacement of a defective battery. Embodiments may include a method (which may be carried out by a computer program product) and an electronic system to implement the method.

Certain embodiments relate to backing up data in an electronic system based upon a method of measuring available backup battery capacity that includes using both "battery floor" and "battery ceiling" measurement types. FIG. 1 is a graph depicting battery charge capacity over the lifespan of a battery, according to embodiments of the present disclosure.

A first type of electronic system may rely on "battery floor" measurement algorithms to determine if a minimum sufficient charge capacity is present to support a data backup operation. A battery floor measurement algorithm can include calculations designed to validate a minimum battery charge capacity, relative to a minimum usable charge capacity (or "floor") of the battery required for the electronic system to perform one or more backup operations. A system that uses a battery floor algorithm can require recharging of a battery, possibly as part of a discharge maintenance cycle, to a level above a preset level, in order to provide adequate charge capacity for a backup operation.

A "battery learning" or "maintenance discharge cycle" operation for a battery floor system can include fully discharging the battery, followed by fully charging the battery, then allowing the battery to discharge or drain back to the level of charge required for supporting backup operations. During the maintenance discharge cycle, the amount of charge stored in the battery may be measured and monitored. A "wait" period, involving battery charging followed by a "resting" period, during which the battery is neither charged nor discharged for a predetermined period of time, may also be required.

Possible benefits of the battery floor system can include use of the battery for backup operations during a significant portion of the maintenance discharge cycle, which may provide consistent and robust coverage of the electronic system for backup operations. Possible downsides of the battery floor system may include reporting to system user(s) a relatively low state of battery charge and/or number of backups possible before a recharge cycle is required. Such reporting may be interpreted negatively by users as showing that the electronic system has a week or insufficient battery/backup capability.

A second type of electronic system may rely on "battery ceiling" measurement algorithms to determine if a minimum sufficient charge capacity is present to support a data backup operation. A battery ceiling measurement algorithm can include calculations designed to validate a minimum battery charge capacity, relative to a level below a maximum possible capacity (or "ceiling") of the battery required for the electronic system to perform one or more backup operations. A system that uses a battery ceiling algorithm can require recharging of the batteries, possibly as part of a discharge maintenance cycle, to a maximum possible capacity level, in order to provide sufficient charge capacity for a backup operation. A "battery ceiling" system can make use of charge capacity drawn from within a range of the battery's maximum (or ceiling) charge capacity, which can provide the system with the maximum possible charge capacity and protection from the battery module.

Possible benefits of a battery ceiling system can include shielding visibility of possible detrimental effects of battery aging from a system user, as the charge is always drawn from the "top" of the battery's capacity range, and the top of the battery's range can be periodically adjusted for the age of the cells. For example, the end user may not see that a given system could potentially perform several times as many backups when the battery is new as compared to after the battery has aged. An end user who views the effects of an aging battery may look upon the electronic system as performing poorly.

Possible downsides of a battery ceiling system can include limited usability of the battery for the first part of the discharge cycle, and the last part of the charging cycle. During the maintenance discharge cycle, the system can indicate insufficient battery capacity to perform a backup (according to the "battery ceiling" algorithm selected to determine the battery capacity), while there may still be sufficient battery capacity to perform a backup according to a battery floor algorithm. This indication can lead to the electronic system being exposed to power failures for much longer than a "battery floor" system, as the battery floor systems can utilize all of the energy above the lower threshold before they stop allowing the battery to provide its energy to the system.

According to embodiments of the present disclosure, a hybrid type of electronic system may rely on both "battery floor" and "battery ceiling" measurement algorithms to determine if a minimum necessary charge capacity is present in order to support a backup operation. According to embodiments, a system that selectively uses a battery floor algorithm during maintenance discharge cycles and a battery ceiling algorithm during other times may offer enhanced data security through shorter windows of battery unavailability (e.g., during maintenance discharge cycles) while reporting a higher level of battery capacity, as measured by a battery ceiling algorithm, to and users and to the electronic system.

FIG. 1 is a graph depicting the battery charge capacity levels and ranges discussed herein for both new and aged batteries, over the lifespan of a battery, according to embodiments of the present disclosure. The Y-axis of FIG. 1 corresponds to relative charge capacity levels of a battery, while the X-axis of FIG. 1 corresponds to a series of "snapshots" of the battery at different times throughout the lifetime of the battery.

Column "New" 120 depicts the charge capacity levels of a new battery, directly following a battery manufacturing process and before the battery has been subjected to any charge/discharge cycles. Battery floor level 108 represents the lowest battery charge level which may be usable by the electronic system. Battery charge levels below floor level 108 (e.g., within unusable range 107) may correspond to battery voltages below a minimum voltage required by the electronic system to function properly. For example, a particular battery or battery pack with a charge level at battery floor level 108 may have a corresponding output voltage of 12.0 volts (V), and its associated electronic system may not function properly when supplied with a voltage less than 12.0 V. Completely discharged level 109 represents the charge capacity of the battery when it is completely discharged. Unusable range 107 represents a charge range in which the battery still has usable charge but the output voltage of the battery is insufficient to properly supply the associated electronic system.

Battery capacity range 110 represents the complete usable capacity of the battery when it is new. The 100% level (i.e., top) of range 110 represents the battery capacity of the new battery when it is completely charged, and the 0% level (i.e., bottom) of range 110 represents the battery capacity of the new battery when it is discharged to battery floor level 108.

Battery capacity range 104F represents a battery "floor" range, bounded by battery floor level 108 (0%) and level 106 (100%). Level 106 represents a minimum charge capacity required of a battery to be able to support one or more data backup operations for the electronic system, when the battery capacity is measured using a floor algorithm. Similarly, battery capacity range 104C represents a battery "ceiling" range, bounded by the 0% and 100% levels. The 0% level represents a minimum charge capacity required of a battery to be able to support one or more data backup operations for the electronic system, when the battery capacity is measured using a ceiling algorithm. In certain embodiments, for example, the ranges 104C and 104F may include sufficient battery capacity to support two backup and/or destage operations for the electronic system.

Columns Time 1 121, Time 2 122 and Time "n" 129 depicted along the X-axis represent battery capacities of the battery at successively later times in the battery's lifespan.

Many types of rechargeable batteries used to support backup operations in electronic systems may exhibit a type of behavior depicted in FIG. 1, where the maximum storage capacity of the battery (e.g., the 100% level of range 104C, and the battery capacity ranges 111, 112 . . . 119) gradually decrease over a number of charge/discharge cycles, and/or over time. The maximum battery storage capacity may decrease as a result of elapsed time, number of charge/discharge cycles, and in response to various environmental factors such as temperature ranges, charging voltage and charging rate.

Throughout the battery's lifespan, battery capacity ranges 104C and 104F may remain constant, as they are determined by battery capacity requirements to support one or more backup operations for the electronic system. However, is the battery ages, the ceiling battery capacity range 104C is gradually lowered, corresponding to the decrease in the battery capacity range 111, 112 . . . 119. Eventually, at Time "n" 129, the battery ceiling capacity range 104C is equivalent to the battery floor capacity range 104F. At Time "n" 129, an (expected) further reduction of battery capacity range (e.g., 119) would not allow the battery to have sufficient charge capacity to support one or more backup operations, and the battery may be discarded or replaced, in order to maintain sufficient backup charge capacity.

FIG. 1 illustrates the progression of the decreasing margin of battery capacity measurements using the battery ceiling algorithm (the distance of battery capacity range 104C above battery floor level 108) in contrast to the constant battery capacity range 104F using the battery floor method.

In order to determine an updated maximum battery capacity range (e.g., 100% level of battery capacity range 111), a "battery learning cycle" or "maintenance discharge cycle" may be periodically performed on the battery. During a battery learning cycle, the battery may be discharged from whatever charge level it is at the beginning of the cycle, to a known discharged state such as battery floor level 108. The battery can then be fully charged to a new maximum charge level (e.g., the 100% level of Time 1 121), while the amount of energy received by the battery is monitored and recorded. The newly determined maximum charge level can then be recorded and used to determine future available charge capacities of the battery.

Figure 2:
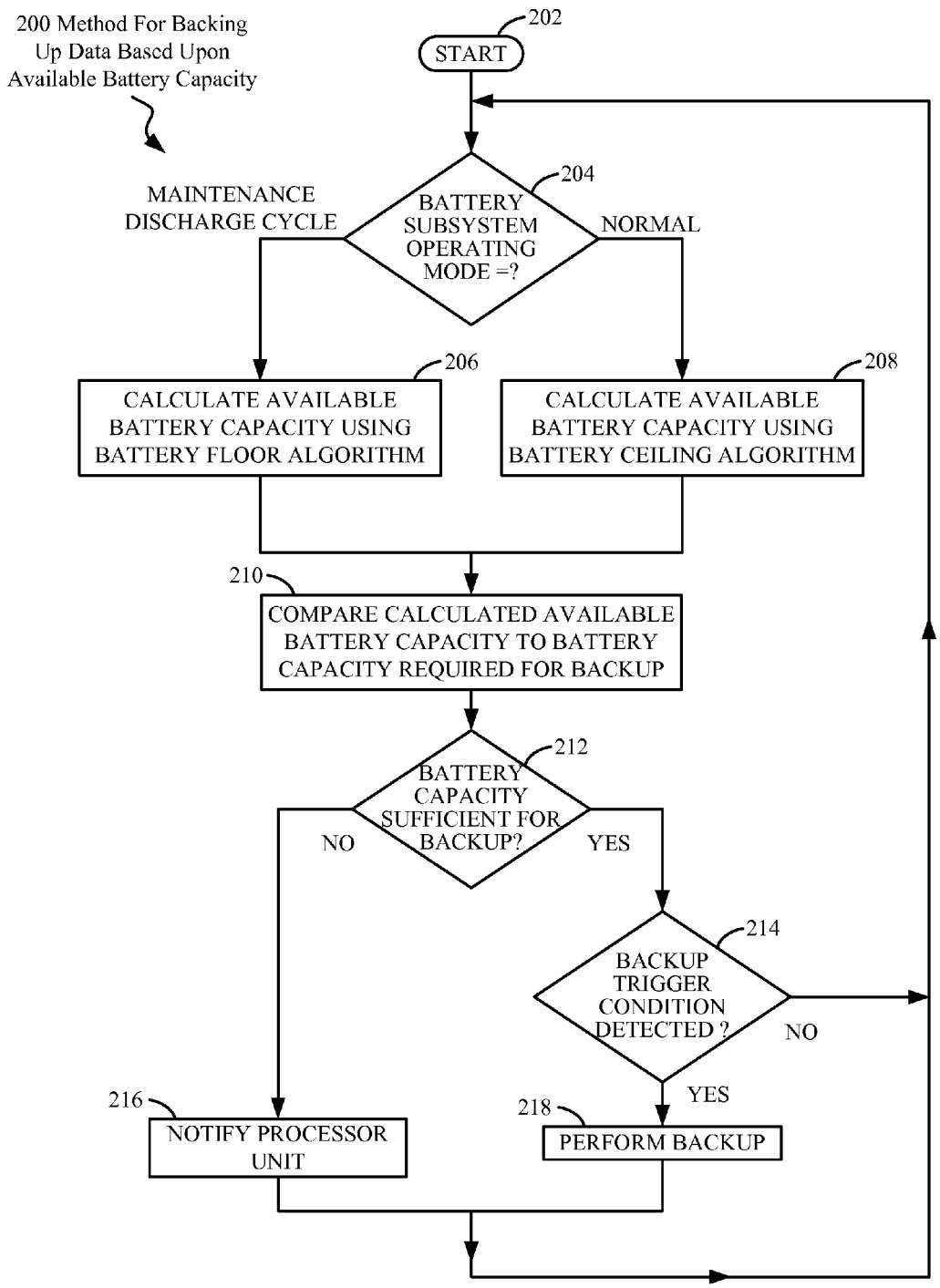
FIG. 2 is a flow diagram illustrating a method for backing up data based on available battery charge capacity, according to embodiments consistent with the figures.

FIG. 2 is a flow diagram illustrating a method for backing up data in an electronic system based on available battery charge capacity, according to embodiments consistent with the figures. The method for backing up data based upon available battery capacity 200 may be useful for making efficient use of available battery capacity, and providing robust data backup capability during both normal and maintenance discharge cycle battery operating modes. Certain embodiments may include multiple redundant battery subsystems including one or more battery cells. The operations of method 200 may account for the battery capacity characteristics and trends characterized by FIG. 1 and its associated description, and may be executed (e.g., as a computer program product) by the system illustrated by FIG. 3 and its associated description. The process 200 moves from start 202 to operation 204.

Operation 204 generally refers to the detection of a battery subsystem operating mode, either a first operating mode of the battery subsystem(s) that is maintenance discharge cycle operating mode or a second operating mode that is a normal operating mode.

If at least one backup battery cell of the battery subsystem(s) is replaced in the electronic system, then a maintenance discharge cycle operating mode is subsequently detected. Detecting a maintenance discharge cycle operating mode may be useful in the case that the newly inserted battery is not fully charged when inserted, and a redundant battery in the system were to fail. In this case, the battery floor algorithm would be used to calculate available backup battery capacity, and ensure continued backup capability until the new battery was fully charged and/or a failed battery was replaced.

Similarly, in the event of failure at least one backup battery cell of the battery subsystem(s), then a maintenance discharge cycle operating mode is subsequently detected. In this case, a battery floor algorithm would be used to enable additional backup operations even in the case of a remaining battery having a relatively low charge level. According to embodiments, in the case where a battery hold-up function is used to keep electronic system running through one or more extended PLD periods, a maintenance discharge cycle operating mode will be subsequently detected. The maintenance discharge cycle operating mode may be useful to enable subsequent backups even though one or more of the batteries in the system may have less charge capacity than may be required by battery ceiling algorithm.

If none of the above-described conditions are met, a second operating mode of the battery subsystem(s) that is a normal operating mode is detected. If a maintenance discharge cycle operating mode is detected, the process moves to operation 206. If a normal operating mode is detected, the process moves to operation 208.

Operation 206 generally refers to calculating, in response to the (first) maintenance discharge cycle operating mode of battery subsystem(s) and by using a (first) battery floor algorithm, the available battery capacity relative to a minimum battery capacity required to support a backup operation. A battery floor algorithm may include calculating a "charge is low" indicator by determining that the available battery capacity of the battery cell(s) is less than a "low capacity threshold". By way of example, in certain embodiments, a "low capacity threshold" may be equivalent to level 106 (FIG. 1). A calculated available battery capacity may be useful for comparison against a battery capacity required to support one or more backup operations. Once an available battery capacity has been calculated, the process moves to operation 210.

Operation 208 generally refers to calculating, in response to the (second) maintenance discharge cycle operating mode of battery subsystem(s) and by using a (second) battery ceiling algorithm, the available battery capacity relative to a maximum battery capacity. A battery floor algorithm may include calculating the "charge is low" indicator by determining that a "full charge capacity" is greater than a sum of the available battery capacity of the battery cell(s) and the "low capacity threshold". A calculated available battery capacity may be useful for comparison against a battery capacity required to support one or more backup operations. Once an available battery capacity has been calculated, the process moves to operation 210.

Operation 210 generally refers to comparing and available battery capacity calculated in operation 206 or 208 to a battery capacity sufficient to complete at least one data backup operation. The available battery capacity may be represented, for example, in terms of units such as amp-hours (A-h), a percent of a maximum battery capacity, or a particular time unit (e.g., minutes) of run time for a particular electronic system. The comparison may be useful in determining if there is sufficient charge capacity to complete one or more backup operations. Once an available battery capacity has been compared to a battery capacity required for a data backup, the process moves to decision 212.

At operation 212, a decision is made regarding the available battery capacity. If the battery capacity is at least sufficient to perform a data backup, the process moves to decision 214. If the battery capacity is not sufficient to perform a data backup, the process moves to operation 216.

At operation 214, a backup trigger condition is sensed. A backup trigger condition may include, for example, a (low) power bus voltage level that is less than a specified minimum voltage level. A low power bus voltage level may indicate a power line disturbance (PLD) event such as a blackout, brownout or failure of a power supply in the electronic system. In certain embodiments, the backup trigger condition may further include the completion of a time interval following a power bus voltage level that is less than a specified minimum voltage level. If a backup trigger condition is detected, the process moves to operation 218. If the backup condition is not detected, the process returns to decision 204.

Operation 216 generally refers to notifying one or more processor unit(s) that the calculated battery capacity is not sufficient to perform a data backup operation. In response to being notified of insufficient battery capacity for a backup operation, the processor unit(s) may initiate a battery recharge cycle or operation, which may be useful in restoring the battery charge capacity to a level sufficient to support one or more backup operations. In certain embodiments, the processor unit may broadcast a notification to a system user or administrator specifying the need for a battery replacement. Once the processor unit has been notified that the battery capacity is not sufficient to perform a data backup, the process returns to decision 204.

Operation 218 generally refers to performing a backup operation to backup, in response to the backup trigger condition (detected in operation 214) and in response to the available battery capacity being sufficient to complete a backup operation (operation 212), data from the electronic system. Data may be backed up (destaged) from a volatile data storage device, e.g., dynamic random-access memory (DRAM) to a non-volatile data storage device such as a hard disk drive or magnetic tape. A backup operation may be useful to preserve data and/or the state of an electronic system in the event of a power event (e.g., blackout or power supply failure). In embodiments, one or more battery subsystems may supply power to the electronic system during a backup operation. In certain embodiments, one or more battery subsystems may supply power to the electronic system (hold-up operation) during a time interval prior to the backup operation. Once the data backup has been performed, the process returns to decision 204.

Figure 3:
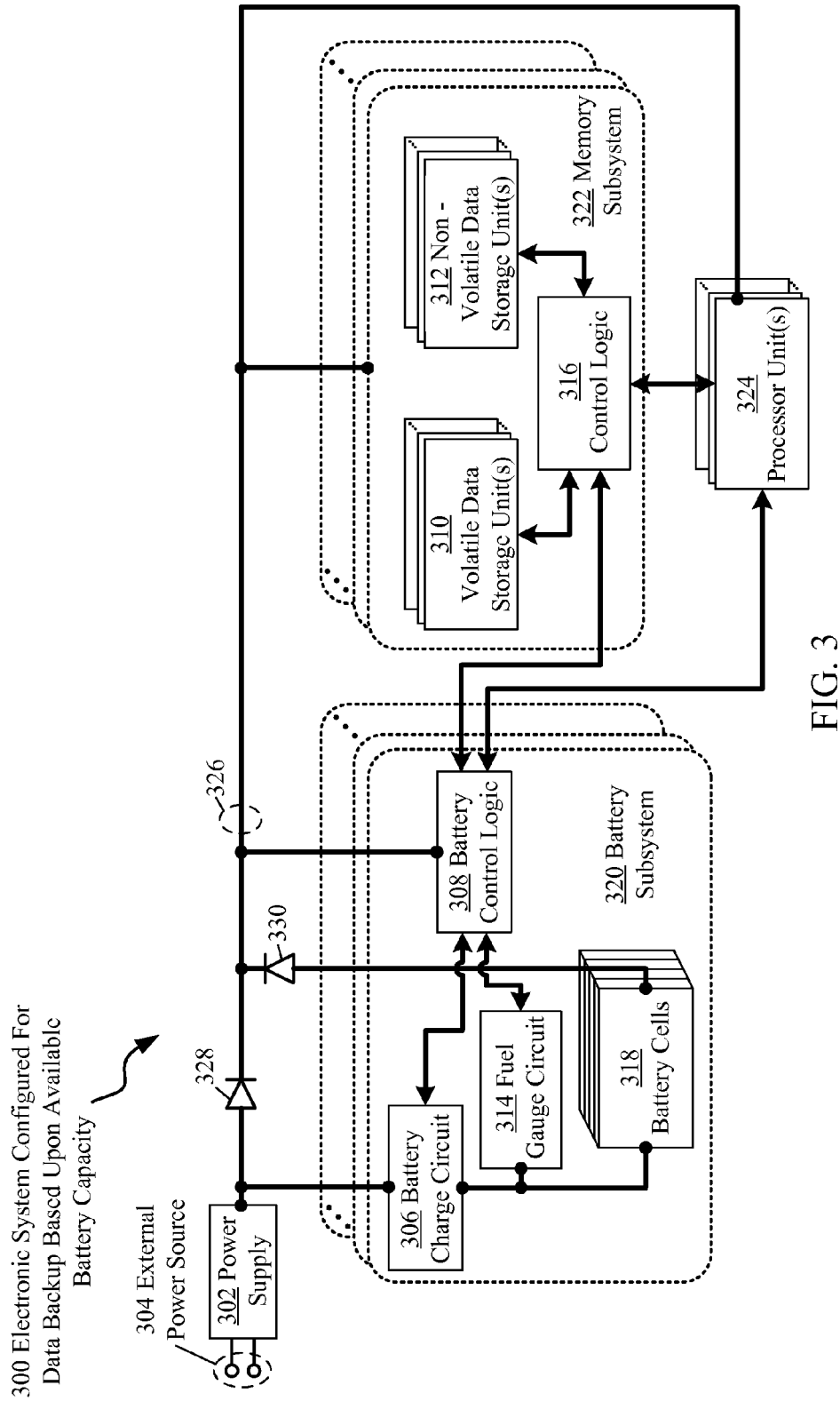
FIG. 3 is a block diagram of an electronic system configured for data backup based upon available battery charge capacity, according to embodiments consistent with the figures.

FIG. 3 depicts a block diagram of an electronic system configured for data backup based upon available battery capacity 300, according to embodiments consistent with the figures. Electronic system 300 may include at least one battery subsystem 320, at least one memory subsystem 322 and at least one processor unit 324, each powered by a power supply 302 and at least one battery cell 318, according to embodiments of the present disclosure.

Power supply 302 may receive power from external power source 304, which may include power line mains (e.g., 110 volts (V) AC or 220 VAC), or other power source such as generator. Power supply 302 may convert power provided from external power source 304 into a variety of output voltages (e.g., 12 volts (V) DC, 2.5 VDC, 1.0 VDC, etc.) suitable for use by memory subsystem(s) 322, processor unit(s) 324 and battery subsystem(s) 320. Power bus 326 may be configured to distribute power from the outputs of power supply 302 and at least one battery cell 318 to the battery subsystem(s) 320, the memory subsystem(s) 322 and processor unit(s) 324.

In certain embodiments the output terminals of the battery cells 318 are connected through an ideal diode 330 to the power bus 326. In embodiments, power supply 302 may also be connected by an ideal diode 328 to power bus 326. Ideal diodes 330 and 328 may be useful for ensuring the correct direction of power flow in situations where one or more battery cells 318 may be discharged and were power supply 302 may not be supplying output voltage to power electronic system 300, respectively.

In embodiments, the electronic system 300 may be useful for backing up data stored on one or more volatile data storage units 310 to one or more non-volatile data storage unit(s) 312. The backup operation may occur in response to a PLD event such as a reduction of supply voltage on power bus 326. In embodiments, the battery subsystem(s) 320, in conjunction with the processor unit(s) 324 may be useful in selecting and implementing a battery charge capacity algorithm to provide robust (extended battery range) backup capabilities for the electronic system 300. In certain embodiments, electronic system 300 may be a computer system, server or a memory subsystem within a computer or other electronic device.

Each battery subsystem 320 may be useful as a charge storage unit which can power a memory subsystem (e.g., 322) and at least one processor unit (e.g., 324) during a power hold-up function and/or a data backup (destage) operation. In certain embodiments, an electronic system 300 may contain a single battery subsystem 320, and in certain embodiments the electronic system 300 may contain multiple (possibly redundant) battery subsystems 320. Each battery subsystem 320 may contain one or more redundant battery cells 318. Redundancy of battery subsystems 320 and/or battery cells 318 may be useful in providing power for backup and/or hold-up operations in the event that one or more battery cells 318 or battery subsystems 320 fails.

Each battery subsystem 320 may function as a stand-alone charge storage unit that is configured to independently detect and report when a data backup is to be initiated by sensing a backup trigger condition (e.g., a voltage drop or insufficient operating voltage on power bus 326) and communicating the backup trigger condition to the processor unit(s) 324. Each battery subsystem 320 may also be configured to charge its battery cell(s) 318, and to monitor, calculate and communicate to processor unit 324 the charge capacity of the battery cell(s) 318. Each battery subsystem 320 may determine whether it has enough charge capacity to perform one or more backup operations. If a battery subsystem 320 has insufficient charge capacity for supporting a backup operation, and the subsystem 320 may remain offline (unavailable to support backup operations) until the charge capacity is restored.

Each battery cell 318 may be useful for storing charge to support backup (destage) and hold-up operations in the absence of power supplied to electronic system 300 by power supply 302. In certain embodiments, at least one battery cell 318 may supply power to the electronic system 300 during a time interval (hold-up time) prior to backing up data from the electronic system. Battery cells 318 may be coupled to power bus 326 to supply power to the electronic system 300, coupled to a battery charge circuit 306 for the purpose of recharging the cells 318 and coupled to a fuel gauge circuit 314 for the purpose of measuring and monitoring an amount of available charge in the battery cells.

According to embodiments, a plurality of battery cells 318 may be interconnected and treated as one functional unit within a battery subsystem 320. In such configurations, groupings of battery cells 318 may be referred to as "battery packs" or "battery modules", and may encompass a wide range of charge capacities. Capacities of battery cells 318, battery packs or battery modules may be expressed in terms of amp-hours (A h), milliamp-hours (mA h), watt-hours (Wh), percent of total battery capacity, number of backup operations supportable or estimated running time of a system. Battery cells 318 include a wide variety of chemistries and types such as lithium-ion, nickel metal hydride and lead-acid.

Battery charge circuit 306 may be coupled to power supply 302 and to battery cells 318 and may be useful in recharging the cells 318. In embodiments, a battery charge circuit 306 may be coupled to and controlled by battery control logic 308, which may respond to commands received from the processor unit(s) 324 to initiate a recharge cycle. Battery charge circuit 306 may be useful in charging battery cells 318 at a rate and for a time appropriate for the cells 318.

Fuel gauge circuit 314 may be coupled to battery control logic 308 and battery cells 318 and may be configured to, in response to detected first and second operating modes of the battery subsystem(s) 320, supply battery status information to the battery control logic 308. In certain embodiments, fuel gauge circuit 314 may be a battery monitoring device, chip or system, configured to monitor the battery cells 318 based upon operating modes (e.g., maintenance discharge cycle for normal) of the battery subsystem(s) 320. Fuel gauge circuit 314 may determine the amount of available charge capacity in battery cells 318 by monitoring discharge information (number of discharge cycles and discharge time), charging time, current flowing into and the voltage at the terminals of battery cells 318. Fuel gauge circuit 314 to be configured to communicate charge capacity information to other functional units (e.g., battery control logic 308 and/or processor unit(s) 324).

Battery control logic 308 may be coupled to fuel gauge circuit 314, battery charge circuit 306, control logic 316 and processor unit(s) 324. In certain embodiments, battery control logic 308 can include programmable logic (e.g., a field-programmable gate array or FPGA), a microprocessor, or other logic chip, which may be configured to execute commands received from processor unit(s) 324. In embodiments, battery control logic 308 may be configured to calculate available battery capacity (based on data received from fuel gauge circuit 314, and upon a battery subsystem operating mode received from processor unit(s) 324, and communicate the state of battery charge (sufficient charge capacity) to processor units(s) 324. If battery control logic 308 determines that there is insufficient charge in battery cells 318 to support at least one backup operation, battery control logic 308 can notify processor unit(s) 324 that it cannot support a backup operation (see operation 212, FIG. 2).

In particular embodiments, battery control logic 308 can be coupled to the power bus 326 and configured to detect a backup trigger condition such as insufficient operating voltage on the power bus 326. In certain embodiments, the control logic 308 can be configured to constantly monitor the state of the battery pack, and if control logic 308 detects that all the battery packs in the system are offline, then it can notify processor unit(s) 324. In embodiments, battery control logic 308 can be configured to execute a battery learning/maintenance discharge cycle in response to a command from processor unit(s) 324.

Each memory subsystem(s) 322 may function as a data storage device that includes both at least one volatile data storage unit (e.g., 310) and at least one non-volatile data storage unit (e.g., 312). Each memory subsystem(s) 322 may be configured to, in response to a backup command from the processor unit(s) 324, back up data from the volatile data storage unit(s) (e.g., 310) to the data least one non-volatile data storage unit (e.g., 312). In certain embodiments, electronic system 300 may include one memory subsystem 322, and in certain embodiments, electronic system 300 may include multiple memory subsystem(s) 322.

Each memory subsystem 322 may include control logic 316 coupled to the processor unit(s) 324, volatile storage unit(s) 310 and non-volatile storage unit(s) 312. Control logic 316 can, in response to a backup command received from processor unit(s) 324, supervise and complete back up of data from volatile storage unit(s) 310 to non-volatile storage unit(s) 312. According to embodiments, volatile storage unit(s) 310 can include random-access memory (RAM), dynamic random-access memory (DRAM), which may be used, for example, as primary storage connected to a processor unit. According to embodiments, non-volatile data storage unit(s) 312 can include devices and technologies such as flash memory, solid-state drive(s), hard disk drive(s) and magnetic tape storage units. Non-volatile data storage unit(s) 312 may be secondary storage devices to which data in volatile data storage units can be backed up or offloaded.

Each processor unit(s) 324 may function as a controlling device that is coupled to communicate with the battery control logic 308 of the battery subsystem(s) 320 and the control logic 316 of at least one memory subsystem 322. The processor unit(s) 324 may send and receive information (e.g., battery capacity information and battery subsystem operating mode information) and commands to the battery subsystem(s) 320 and the memory subsystem(s) 322.

In embodiments, processor unit(s) 324 can be service and/or maintenance processor(s) or other type of processor(s) including, but not limited to a computer system, microprocessor or programmable logic chip. In particular embodiments, processor unit(s) 324 can include a processing circuit or processor complex, memory, data storage, and other features found in a complex computing system.

In certain embodiments, processor unit(s) 324 may be configured to determine or detect a (first or second) battery subsystem operating mode (see FIG. 2, operation 204) and communicate that operating mode (e.g., normal or maintenance discharge cycle) to battery control logic 308. Processor unit(s) 324 can also be configured to compare available battery capacity information (received from control logic 308) to a battery capacity sufficient to complete a backup operation (operation 210, FIG. 2), and initiate a backup operation (operation 218, FIG. 2), in response to a backup trigger condition (operation 214, FIG. 2), if it determines that the battery capacity of battery cells 318 is sufficient to support the operation.

In embodiments, processor unit(s) 324 can also be configured to initiate a recharge cycle for battery cells 318, in response to being notified of insufficient battery charge support a backup operation. In certain embodiments, a processor unit(s) 324 can send a notification to a user or system administrator specifying the need for battery replacement (see 129, FIG. 1 and FIG. 2, operation 216). Processor unit(s) 324 can be configured to control initiation of a battery learning/maintenance discharge cycle by sending a command to battery control logic 308.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 4:
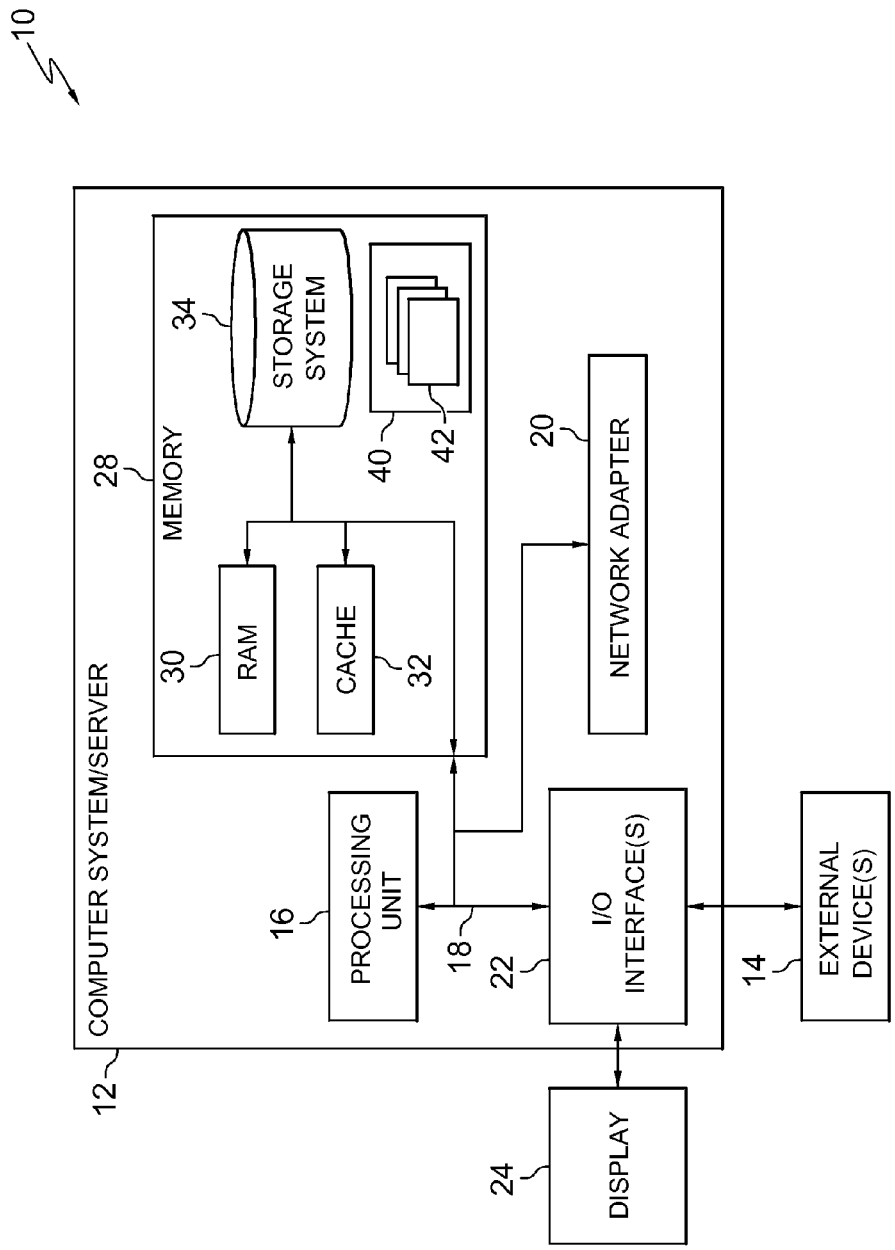
FIG. 4 depicts a cloud computing node according to an embodiment of the present disclosure.

Referring now to FIG. 4, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 5:
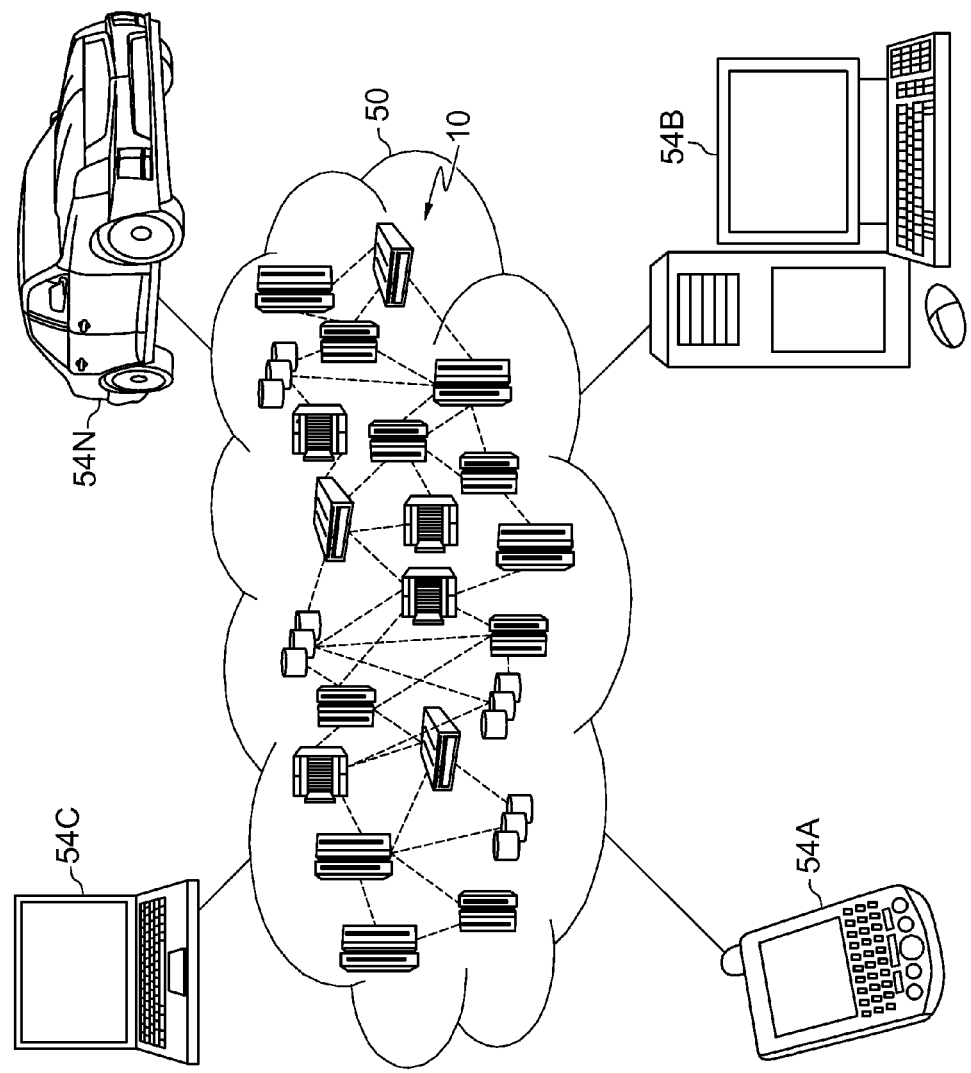
FIG. 5 depicts a cloud computing environment according to an embodiment of the present disclosure.

Referring now to FIG. 5, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 6:
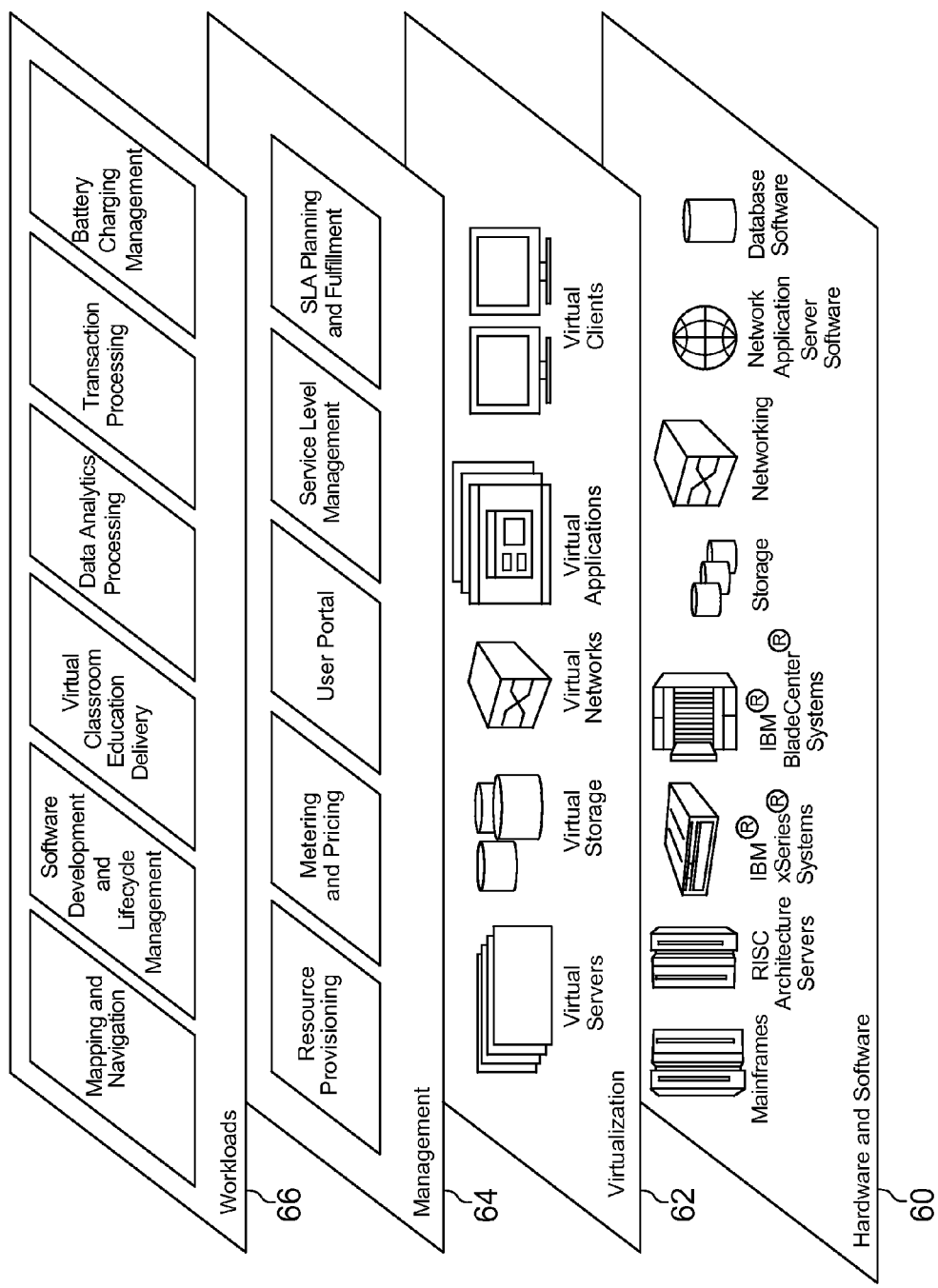
FIG. 6 depicts abstraction model layers according to an embodiment of the present disclosure.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and battery charging management 96.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of backing up, based upon an available battery capacity of at least one backup battery cell of at least one battery subsystem, data from an electronic system, the method comprising:
    detecting a first operating mode of the at least one battery subsystem that is a maintenance discharge cycle operating mode;
    calculating the available battery capacity, in response to the first operating mode of the at least one battery subsystem and by using a first algorithm based upon a minimum battery capacity;
    detecting a second operating mode of the at least one battery subsystem that is a normal operating mode;
    calculating the available battery capacity, in response to the second operating mode of the at least one battery subsystem and by using a second algorithm based upon a maximum battery capacity;
    comparing the available battery capacity to a battery capacity sufficient to complete a backup operation;
    detecting a backup trigger condition that includes a power bus voltage level that is less than a specified minimum voltage level; and
    backing up, in response to the backup trigger condition and in response to the available battery capacity being sufficient to complete a backup operation, data from the electronic system.

2. The method of claim 1, wherein the first algorithm is a battery floor algorithm that includes calculating a "charge is low" indicator by determining that the available battery capacity of the at least one battery cell is less than a "low capacity threshold".

3. The method of claim 1, wherein the second algorithm is a battery ceiling algorithm that includes calculating the "charge is low" indicator by determining that a "full charge capacity" is greater than a sum of a the available battery capacity of the at least one battery cell and a "low capacity threshold".

4. The method of claim 1, further comprising notifying, in response to the available battery capacity being less than sufficient to complete a backup operation, at least one processor unit of the available battery capacity.

5. The method of claim 4, further comprising initiating, in response to notifying the at least one processor unit of the available battery capacity, a battery recharge cycle.

6. The method of claim 1, further comprising detecting, in response to a power line disturbance (PLD) event, a first operating mode of the at least one battery subsystem that is a maintenance discharge cycle operating mode.

7. A computer program product for backing up, based upon an available battery capacity of at least one backup battery cell of at least one battery subsystem, data from an electronic system, the computer program product comprising at least one computer readable storage medium having program instructions embodied therewith, wherein the at least one computer readable storage medium is not a transitory signal per se, the program instructions executable by at least one computer processor circuits to cause the at least one computer processor circuits to perform a method comprising:
- detecting a first operating mode of the at least one battery subsystem that is a maintenance discharge cycle operating mode;
- calculating, in response to the first operating mode of the at least one battery subsystem and by using a first algorithm, the available battery capacity relative to a minimum battery capacity;
- detecting a second operating mode of the at least one battery subsystem that is a normal operating mode;
- calculating, in response to the second operating mode of the at least one battery subsystem and by using a second algorithm, the available battery capacity relative to a maximum battery capacity;
- comparing the available battery capacity to a battery capacity sufficient to complete a backup operation;
- detecting a backup trigger condition that includes a power bus voltage level that is less than a specified minimum voltage level; and
- backing up, in response to the backup trigger condition and in response to the available battery capacity being sufficient to complete a backup operation, data from the electronic system.

8. The computer program product of claim 7, wherein the program instructions are executable to further cause the one or more processor circuits to detect, in response to replacement of at least one backup battery cell of at least one battery subsystem, a first operating mode of the at least one battery subsystem that is a maintenance discharge cycle operating mode.

9. The computer program product of claim 7, wherein the program instructions are executable to further cause the one or more processor circuits to detect, in response to failure of at least one backup battery cell of at least one battery subsystem, a first operating mode of the at least one battery subsystem that is a maintenance discharge cycle operating mode.

10. The computer program product of claim 7, wherein the backup trigger condition further includes a completion of a time interval following the power bus voltage level that is less than the specified minimum voltage level, the time interval completed prior to backing up of the data from the electronic system.

11. The computer program product of claim 10, wherein the program instructions are executable to further cause the one or more processor circuits to supply, from the at least one battery subsystem, power to the electronic system during the time interval.

12. An electronic system for, in response to a backup a backup trigger condition that includes a power bus voltage level that is less than a specified minimum voltage level, backing up data, the electronic system comprising:
- at least one battery subsystem that includes:
  - at least one battery cell coupled to a power bus to, during hold-up operations and backup operations, supply power to at least one memory subsystem and at least one processor unit;
  - a fuel gauge circuit coupled to the at least one battery cell and to battery control logic, to, in response to detected first and second operating modes of the at least one battery subsystem, supply battery status information to the battery control logic; and
  - battery control logic coupled to the power bus to:
    - calculate, in response to battery status information and in response to detected first and a second operating modes received from the at least one processor unit, available battery capacity information; and
    - detect the backup trigger condition; and
- at least one processor unit coupled to the battery control logic and to a fuel gauge circuit to:
  - receive available battery capacity information;
  - detect a first and a second operating mode of at least one battery subsystem;
  - compare the available battery capacity information to a battery capacity sufficient to complete a backup operation; and
  - issue, in response to the compare and in response to a backup trigger condition, a backup command; and
- at least one memory subsystem that includes:
  - control logic coupled to the at least one processor unit, to, in response to the backup command, back up data from the electronic system.

13. The system of claim 12, wherein the at least one memory subsystem further comprises at least one volatile data storage unit coupled to the control logic and at least one non-volatile data storage unit coupled to the control logic.

14. The system of claim 12, further comprising a power supply coupled to an external power source to supply, through a power bus, power to at least one circuit of a group consisting of: a battery charge circuit, a battery control logic, at least one memory subsystem and at least one processor unit.

15. The system of claim 12, the at least one battery subsystem further comprising a battery charge circuit coupled to a power supply to, in response to a command from the at least one processor unit, charge the at least one battery cell.

16. The system of claim 12, wherein the backup trigger condition includes a drop in a power supply output voltage.

* * * * *